United States Patent [19]
Fujihira et al.

[11] Patent Number: 5,869,372
[45] Date of Patent: Feb. 9, 1999

[54] METHOD OF MANUFACTURING A POWER SEMICONDUCTOR DEVICE

[75] Inventors: Tatsuhiko Fujihira; Seiji Momota; Takeyoshi Nishimura; Kazutoshi Sugimura; Masao Yoshino; Takashi Kobayashi, all of Nagano, Japan

[73] Assignee: Fuji Electric Co., Ltd., Japan

[21] Appl. No.: 555,426

[22] Filed: Nov. 9, 1995

[30] Foreign Application Priority Data

Nov. 10, 1994 [JP] Japan ..................................... 6-276195

[51] Int. Cl.⁶ ................................................. H01L 21/336
[52] U.S. Cl. ............................................. 438/268; 438/273
[58] Field of Search ................................... 438/268, 273, 438/274, 279, 281, 981, 529

[56] References Cited

U.S. PATENT DOCUMENTS

| | | | |
|---|---|---|---|
| 3,933,528 | 1/1976 | Sloan, Jr. .................................. | 438/529 |
| 5,550,067 | 8/1996 | Kuroyanagi et al. .................... | 438/273 |
| 5,559,045 | 9/1996 | Yamamoto ............................... | 438/273 |
| 5,563,437 | 10/1996 | Davies et al. ........................... | 438/268 |

FOREIGN PATENT DOCUMENTS

| | | |
|---|---|---|
| 0294868A1 | 12/1914 | European Pat. Off. . |
| 56-027933 | 3/1981 | Japan . |

Primary Examiner—Chandra Chaudhari
Attorney, Agent, or Firm—Rossi & Associates

[57] ABSTRACT

A semiconductor device manufacturing process is disclosed in which one processing step is reduced by replacing the photoresist film conventionally used for masking in the formation of the heavily doped n-type layer by an oxide film, and by monitoring, in the monitor region, the simultaneous formation of the contact holes in the oxide films different in the respective thickness thereof. An n+ region is formed by using a second insulation film and a polysilicon gate electrode formed on a semi-conductor wafer as masks for implanting arsenic ions. Further, a contact hole to be formed on a p-type region covered with a fourth insulation film and a second insulation film and a contact hole to be formed on the n+ region covered with the fourth insulation film are formed simultaneously under the monitoring of the formation of the contact holes in a monitor region.

11 Claims, 14 Drawing Sheets

SEE FIG. 40(B)

METHOD OF MANUFACTURING A POWER SEMICONDUCTOR DEVICE

FIELD OF THE INVENTION

The present invention relates generally to semiconductor devices. More specifically, the invention relates to semiconductor devices such as insulated gate type devices, ICs, power ICs, etc. and a method of manufacturing such semiconductor devices.

BACKGROUND OF THE INVENTION

Various types of semiconductor devices and techniques for manufacturing the semiconductor devices are known. For example, the U.S. Pat. No. 5,053,838 discloses a power IC and the manufacturing method thereof, U.S. Pat. No. 4,959,699 and U.S. Pat. No. 5,008,725 disclose vertical MOSFETs and the manufacturing methods thereof, U.S. Pat. No. 4,364,073 and U.S. Pat. No. 5,034,336 disclose vertical IGBTs and the manufacturing methods thereof, and U.S. Pat. No. 5,191,396 and U.S. Pat. No. 5,162,883 disclose a lateral MOSFET, lateral IGBT and the manufacturing methods thereof.

As a typical example of the prior art, the structure of an IC portion of the power IC disclosed in the U.S. Pat. No. 5,053,838 and the manufacturing method thereof are shown in FIGS. 42 to 48 and will be described with reference to certain process steps.

STEP(1): Referring now to FIG. 42, a first insulation film 3 of about 1000 nm in thickness is formed by thermally oxidizing an n-type semiconductor layer 2, doped with phosphorus at around $1 \times 10^{16}$ cm$^{-3}$, in steam at 1100° C. for 3 hours.

STEP(2): As shown in FIG. 43, windows 4 are formed by selectively etching the predetermined parts of the first insulation film 3 by hydrofluoric acid etc. by using for masking a photoresist film patterned by photolithography.

STEP(3): Boron ions are then implanted at the dose amount of $2 \times 10^{13}$ cm$^{-3}$ in the surface layer of the n-type semiconductor layer 2 through the windows 4 at the acceleration voltage of 100 keV. STEP(4): Referring now to FIG. 44, the boron ions are diffused by heat treatment at 1100° C. for 3 hours to form p-type regions 5 in the surface layer of the n-type semiconductor layer 2. STEP(5): Subsequently to this, steam oxidation is conducted at 1100° C. for 80 min to form second insulation films 61 of thermally oxidized silicon of around 650 nm in thickness. The second insulation films 61, used for inter-layer insulation of wiring in the ICs or for field plates of the power devices, need not be formed precisely in the thickness thereof.

STEP(6): As shown in FIG. 45, the predetermined parts of the first and second insulation films are simultaneously etched away by hydrofluoric acid etc. by using a photoresist film patterned by photolithography for masking.

STEP(7): Third insulation films 7 of oxide of about 50 nm in thickness are then formed, for example, by dry oxidation at 1000° C. for 30 min.

STEP(8): Referring now to FIG. 46, a poly-crystalline silicon film is deposited to a thickness of 500 nm by CVD. Phosphorus ions are implanted at the acceleration voltage of 100 keV to the poly-crystalline silicon film at the dose amount of $5 \times 10^{15}$ cm$^{-2}$. The implanted phosphorus ions are activated by heat treatment at 1000° C. for 10 min. Gate electrodes 8 are formed by selectively etching the poly-crystalline silicon film by using a photoresist film patterned by photolithography for masking.

STEP(9): Then, heavily doped n-type regions 9 are formed in the surface layers of the n-type substrate 2 and a p-type region by implanting arsenic ions at the dose amount of $5 \times 10^{15}$ cm$^{-2}$ at the acceleration voltage of 150 keV by using for masking a photoresist film 15 patterned by photolithography, the first insulation films 3 and the gate electrodes 8.

STEP(10): As shown in FIG. 47, a fourth insulation film 10 of BPSG film of about 1000 nm in thickness is formed by CVD etc.

STEP(11): Contact holes 11, which reach the p-type regions 5 and the heavily doped n-type regions 9 through the fourth insulation film 10, are formed by selectively etching the BPSG film by using a photoresist film patterned by photolithography for masking as illustrated in FIG. 48.

STEP(12): Finally, metal electrodes 12 are formed by selectively etching an Al—Si—Cu film, deposited to a thickness of about 1000 nm by sputtering etc., by using a photoresist film patterned by photolithography for masking.

The semiconductor device 1 manufactured by the above process comprises a p-channel MOSFET further comprising a back gate electrode 12(PB), a source electrode 12(PS), a gate electrode 8(PG), and a drain electrode 12(PD); and an n-channel MOSFET further comprising a back gate electrode 12(NB), a source electrode 12(NS), a gate electrode 8(NG), and a drain electrode 12(ND). The illustrated device structure facilitates obtaining CMOS-ICs. The manufacturing method described above, however, includes ten photo-processing steps.

It is therefore necessary to reduce the photo-processing steps for reducing the manufacturing cost of the semiconductor devices. Accordingly, it is an object of the invention to provide a semiconductor device that has the same structure and exhibits the same performance with those of the conventional device and to provide a method of manufacturing the semiconductor device that reduces one step from the conventional photo-processing steps and facilitates reducing the cost of the semiconductor device.

SUMMARY OF THE INVENTION

According to an aspect of the present invention, there is provided a method of manufacturing at least one semiconductor device on a single- or multi-layered semiconductor substrate, the method comprising the steps of: forming a first insulation film on a major surface of a layer of a first conductivity type of the semiconductor substrate; selectively removing a part of the first insulation film, thereby to form at least one window in the first insulation film; implanting impurity ions of a second conductivity type into the layer of the first conductivity type through the at least one window; selectively forming at least one region of the second conductivity type by thermally diffusing the implanted impurity ions into the layer of the first conductivity type; forming a second insulation film prior to or after the formation of the at least one region of the second conductivity type; selectively removing a part of the first and second insulation films thereby to expose a part of the layer of the first conductivity type and a part of the at least one region of the second conductivity type; forming third insulation films on the exposed part of the layer of the first conductivity type and the exposed part of the at least one region of the second conductivity type; forming gate electrodes on the third insulation films; forming heavily doped regions of the first conductivity type by selectively implanting impurity ions of the first conductivity type, using the first insulation film, the second insulation film and the gate electrodes for masking, into the portions of the layer of the first conductivity type and the at least one region of the second conductivity type, the portions being not covered with the first insulation film, the second insulation film and the gate electrodes; forming a fourth insulation film atop the at least one semiconductor device; and simultaneously forming at least one contact hole that reaches the at least one region of the second conductivity type through the fourth and second insulation films and at least one contact hole that reaches the heavily doped regions of the first conductivity type through the fourth insulation film.

It is preferable that the second insulation film is from about twice to about ten times as thick as the average implantation depth of the impurity ions of the first conductivity type in the insulation film. When a plurality of the semiconductor devices are to be arranged on the semiconductor substrate, it is quite effective to dispose at least one monitor region for judging the end of etching for removing the fourth and second insulation films at the formation of the contact holes on at least one of the at least one region of the second conductivity type, the at least one of the at least one region being formed on a portion of the semiconductor substrate therein the plurality of the semiconductor device is not arranged, the at least one monitor region comprising a second insulation film and a fourth insulation film laminated on the at least one of the at least one region of the second conductivity type, and to terminate the etching after the second and fourth insulation films has been removed and the at least one of the at least one region has been exposed.

Preferably, the at least one monitor region is arranged outside the region of the semiconductor substrate, therein the plurality of the semiconductor devices are arranged. More specifically, the at least one monitor region is surrounded by a plurality of the semiconductor devices. Alternatively, the at least one monitor region is arranged on at least one of scribe lines disposed for separating each of the plurality of the semiconductor device from one another. Still alternatively, the at least one monitor region is arranged in the peripheral region of the semiconductor substrate therein the plurality of the semiconductor device is not arranged. The at least one monitor region may also be arranged in the combined fashion on the locations described above. The etching of the fourth and second insulation films may be terminated after a predetermined period of time has elapsed, the predetermined period consisting of a leeway period and an estimated period, the estimated period being a determined or calculated period of time during that the fourth and second insulation films are completely removed.

In the at least one of the semiconductor device manufactured by the method of the present invention, the thickness of the insulation film varies around each of the contact holes, between the contact holes, or around and between the contact holes. The at least one of the semiconductor device of the invention includes at least one of the devices selected from a group consisting of an insulated gate type device, an IC and power IC. The at least one of the semiconductor device of the invention includes at least one of the devices selected from a group consisting of a vertical MOSFET, a vertical IGBT, a lateral MOSFET and a lateral IGBT.

By setting the second insulation film at a thickness of about twice or more as thick as the average implantation depth (at that the dose amount of the implanted impurity ions shows a maximum) of the impurity ions of the first conductivity type (e.g. arsenic), the second insulation film is provided with a function of a mask for arsenic ion implantation for forming the at least one heavily doped n-type region. The required thickness of the second insulation film is from around 100 nm (the minimum thickness for masking the ion implantation) to around 500 nm (due to mass-productivity consideration). Since the required thickness of the second insulation film is thinner than the conventional thickness, it is required to control the thickness of the second insulation film more accurately. Further, it is preferable to form the second insulation film after the formation of the at least one region of the second conductivity type. Since the lattice defects caused in the at least one region of the second conductivity type by the implantation of the impurity ions (boron ions etc.) of the second conductivity type are reduced by annealing conducted at the formation of the at least one region of the second conductivity type, the oxide film deposited on the annealed at least one region of the second conductivity type exhibits an excellent film quality. And, by using the second insulation film for masking the implantation of the impurity ions of the first conductivity type, the conventional processing step of depositing a masking photoresist film becomes unnecessary and one photo-processing step is eliminated.

For forming the contact holes, the second and fourth insulation films should be removed from above the at least one region of the second conductivity type and the fourth insulation film from above each of the heavily doped n-type regions. Since these insulation films are formed of an oxide film, the thickness thereof for the fourth insulation film is around 100 nm and the thickness thereof for the second insulation film is 100 to 500 nm, the film laminate of the fourth and second insulation film should completely be removed from above the at least one region of the second conductivity type. For securing the complete removal of the film laminate, at least one monitor region is disposed. The monitor region is disposed outside the region of the semiconductor substrate in which region the at least one semiconductor device is arranged. In addition, the monitor region has a region of the second conductivity type on that are laminated a second insulation film and a fourth insulation film.

When the monitor region may occupy a relatively narrow area, it is preferable to surround the monitor region by a plurality of the semiconductor devices for facilitating detection of the end of the etching in a plasma-etching apparatus. When the monitor region requires a relatively wide area, it is preferable to dispose the monitor region on a scribe line or in the peripheral region of the semiconductor wafer for facilitating monitoring. A plurality of the monitor regions may be disposed in a combined fashion on the locations described above. Alternatively or additionally, the etching of the fourth and second insulation films may securely be terminated after a predetermined period of time has elapsed, the predetermined period consisting of a leeway period and an estimated period, the estimated period being a determined or calculated period of time during that the fourth and second insulation films are completely removed. The predetermined period of time is determined by considering the variation of the etching environments etc.

BRIEF DESCRIPTION OF THE DRAWINGS

The invention will be described with reference to certain preferred embodiments thereof and the accompanying drawings, wherein.

BRIEF DESCRIPTION OF THE PREFERRED EMBODIMENTS

Figure 1:
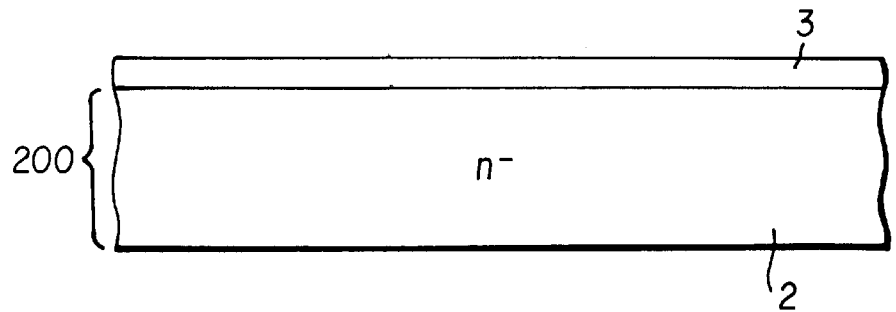
FIG. 1 is a cross section for explaining STEP(1) of a first embodiment of a method of manufacturing a power IC according to the present invention.

The present invention will now be explained hereinafter with reference to the accompanied drawings which illustrate preferred embodiments of the invention. The similar parts of the embodiments with those of FIGS. 42 to 48 are designated by the same reference numerals. The invention will be explained by way of example in that a first conductivity type is n-type and a second conductivity type is p-type.

A first embodiment of a manufacturing method of the invention will be explained with reference to FIGS. 1 to 7. The first embodiment is an example in that the present invention is applied to the IC portion of the power IC of FIGS. 42 to 48. The present manufacturing method will be explained in the order of preferred processing steps.

STEP(1): Referring now to FIG. 1, a first insulation film 3 of about 1000 nm in thickness is formed by thermally oxidizing an n-type semiconductor layer 2, doped with phosphorus at around $1 \times 10^{16}$ cm$^{-3}$, in steam at 1100° C. for 3 hours. Hereinafter, a semiconductor substrate on which is formed the n-type semiconductor layer 2 will be referred to as "semiconductor wafer".

Figure 2:
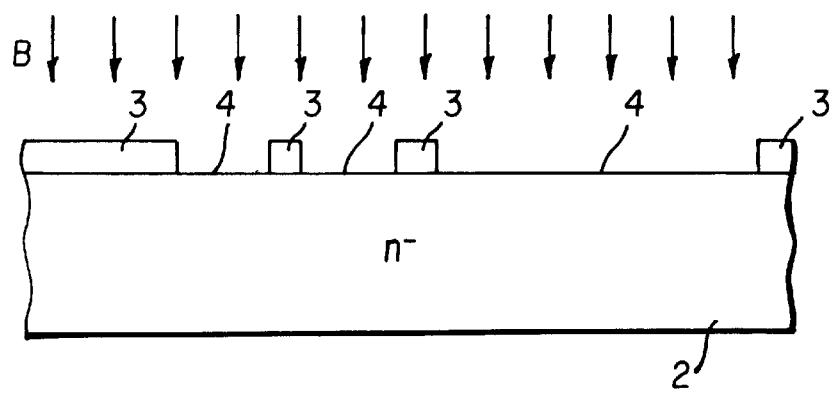
FIG. 2 is a cross section for explaining STEP(2) and STEP(3) of the first embodiment.

STEP(2): Referring now to FIG. 2, windows 4 are formed by selectively etching the predetermined parts of the first insulation film 3 by hydrofluoric acid etc. by using for masking a photoresist film patterned by photolithography.

STEP(3): Boron ions are selectively implanted at the dose amount of $2 \times 10^{13}$ cm$^{-2}$ in the surface layer of the n-type semiconductor layer 2 through the windows 4 at the acceleration voltage of 100 keV.

Figure 3:
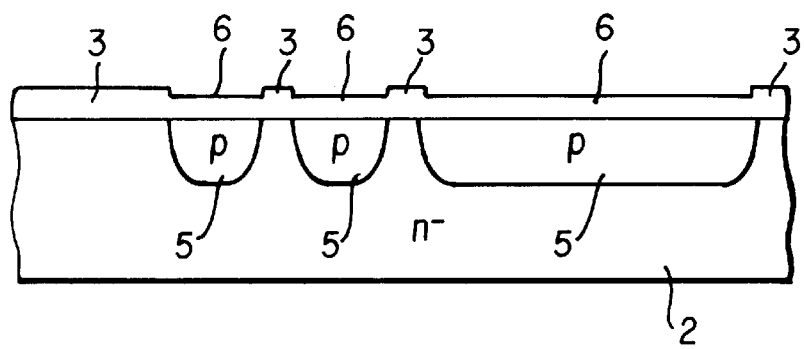
FIG. 3 is a cross section for explaining STEP(4) and STEP(5) of the first embodiment.

STEP(4): Referring now to FIG. 3, the boron ions are diffused by heat treatment at 1100° C. for 3 hours to form p-type regions 5 in the surface layer of the n-type semiconductor layer 2.

STEP(5): Subsequently to this, second insulation films 6 are formed to a thickness thick enough to prevent arsenic ions from penetrating therethrough at the implantation thereof. The second insulation films 6 are formed by steam oxidation at 1100° for 20 min, thereby to thermally oxidize silicon to form the oxide films of about 300 nm in thickness (that is six times as thick as the average implantation depth of arsenic ions into the oxide films). The minimum thickness of the second insulation films is the minimum thickness through that arsenic ions never penetrate and around 100 nm twice as thick as the average implantation depth of arsenic ions. The maximum thickness of the second insulation films is at around 500 nm five times as thick as the average implantation depth of arsenic ions due to mass-productivity consideration. Therefore, the desirable thickness of the second insulation films is 200 to 350 nm. In this processing step, it is important to control the thickness of the second insulation films more accurately than by the prior art. The second insulation films may be formed prior to STEP(4). However, it is better to form the second insulation films after STEP(4), since the lattice defects caused in the silicon surface layer by boron ion implantation are annealed out in the STEP(4).

Figure 4:
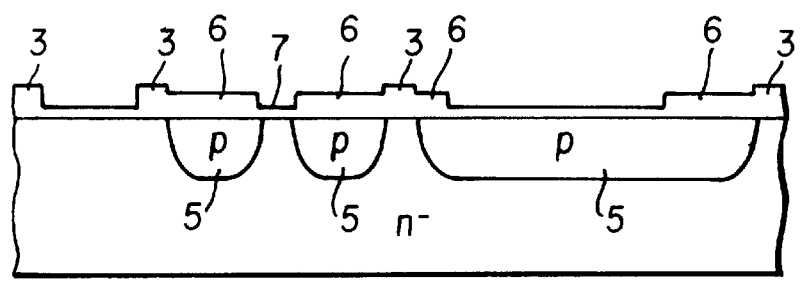
FIG. 4 is a cross section for explaining STEP (6) and STEP(7) of the first embodiment.

STEP(6): Referring now to FIG. 4, the predetermined parts of the first and second insulation films are simultaneously etched away by hydrofluoric acid etc. by using a photoresist film patterned by photolithography for masking. Here, it is important to leave the second insulation films above the p-type regions 5 except the portions thereof in which the heavily doped n-type regions are formed by arsenic ion implantation.

STEP(7): Third insulation films 7 (as gate oxide films) of oxide of about 50 nm in thickness are then formed, for example, by dry oxidation at 1000° for 30 min.

Figure 5:
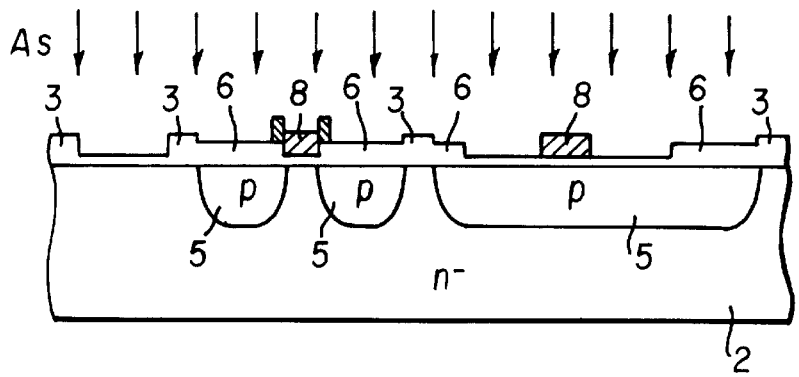
FIG. 5 is a cross section for explaining STEP(8) and STEP(9) of the first embodiment.

STEP(8): Referring now to FIG. 5, a poly-crystalline silicon film is deposited to a thickness of 500 nm by CVD. Phosphorus ions are implanted at the acceleration voltage of 100 keV to the poly-crystalline silicon film at the dose amount of $5 \times 10^{15}$ cm$^{-2}$. The implanted phosphorus ions are activated by heat treatment at 1000° C. for 10 min. Gate electrodes 8 are formed by selectively etching the poly-crystalline silicon film using a photoresist film patterned by photolithography for masking.

STEP(9): Heavily doped n-type regions 9 are then formed in the surface layers of the n-type substrate 2 and a p-type region by selectively implanting arsenic ions at the dose amount of $5 \times 10^{15}$ cm$^{-2}$ at the acceleration voltage of 150 keV by using the first and second insulation films and the gate electrodes for masking without employing any photolithography.

Figure 6:
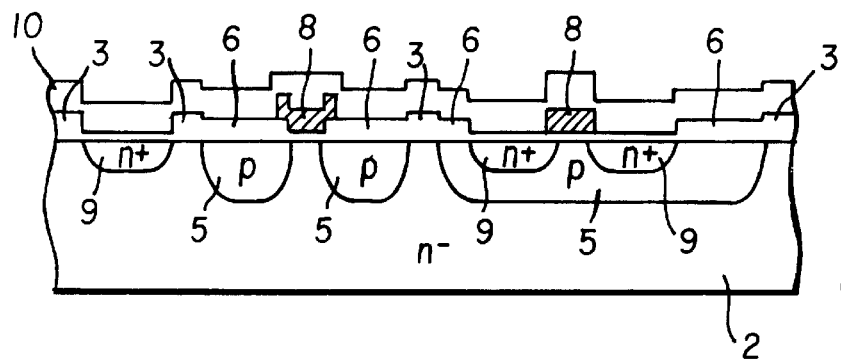
FIG. 6 is a cross section for explaining STEP(10) of the first embodiment.

STEP(10): Referring now to FIG. 6, a fourth insulation film 10 of BPSG film of about 1000 nm in thickness is formed by CVD etc.

Figure 7:
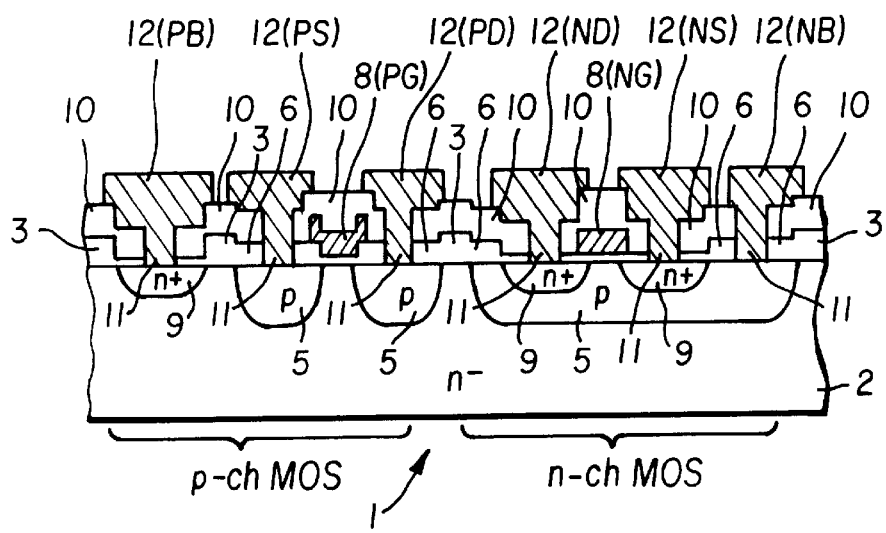
FIG. 7 is a cross section for explaining STEP(11) and STEP(12) of the first embodiment as well as showing the major part of the semiconductor device manufactured by the first embodiment.

STEP(11): Referring now to FIG. 7, contact holes 11, which reach the p-type regions 5 through the fourth insulation film 10 and the second insulation films 6, and contact holes 11, which reach the heavily doped n-type regions 9 through the fourth insulation film, are simultaneously formed by selectively etching the BPSG film by using a photoresist film patterned by photolithography for masking.

STEP(12): Finally, metal electrodes 12 are formed by selectively etching an Al—Si—Cu film, deposited to a thickness of about 1000 nm by sputtering etc., by using a photoresist film patterned by photolithography for masking.

The specific feature of the above described process for manufacture and its differences from the conventional process for manufacture will be explained below.

In the STEP(5), the second insulation films are formed to a thickness as thin as possible but still thick enough to prevent the arsenic ions, implanted for forming the heavily doped n-type region, from penetrating through the second insulation films. The second insulation films are formed to a thickness twice as thick as the arsenic ion implantation depth, and the minimum thickness is 100 nm. On the other hand, thicker second insulation films are better for preventing the arsenic ion penetration, though the film thickness tends to deviate from its reference value as the second insulation films thickness increases. However, the maximum thickness that considers the mass-productivity is around 500 nm. Therefore, a preferable thickness of the second insulation films is 100 to 350 nm. It is more preferable to confine the second insulation films within a thickness between 200 and 350 nm. In any case, it is important to control the thickness of the second insulation films more accurately than by the prior art. The second insulation films may be formed prior to the STEP(4). However, it is preferable to form the second insulation films after the STEP(4), since the lattice defects caused in the silicon surface layer by boron ion implantation are annealed out through the STEP(4).

The heavily doped n-type regions can be selectively formed by the STEPs (5), (6) and (9), and by avoiding the step of patterning the photoresist film by photolithography (STEP(9) of the prior art) that has been indispensable in the prior art. Thus, one step is eliminated from the conventional photo-processing steps.

By utilizing the monitoring area in the STEPs (6) and (11), the contact holes which reach the p-type regions 5, the contact holes which reach the heavily doped regions 9, and, if necessary, the contact holes which reach the p-type regions 5 and the heavily doped regions 9 can be simultaneously formed as by the prior art. The number of steps for forming these contact holes is the same with that of the prior art.

FIG. 7 is a cross section of the major part of the semiconductor device manufactured by the method described above. A p-channel MOS is shown on the left hand side of the figure, and an n-channel MOS on the right hand side of the figure. A back gate electrode 12(PB), a source electrode 12(PS), and a drain electrode 12(PD) in the p-channel MOS; and a back gate electrode 12(NB), a source electrode 12(NS), a drain electrode 12(ND), and a gate electrode 8(NG) in the n-channel MOS are formed on the major surface of the semiconductor wafer 200 to form a semiconductor device 1.

FIGS. 8 to 14 show a second embodiment of a manufacturing method of the present invention. The second embodiment is an example that applies the present invention to a vertical MOSFET. Explanation will be made only on the differences between the second and first embodiments.

Figure 8:
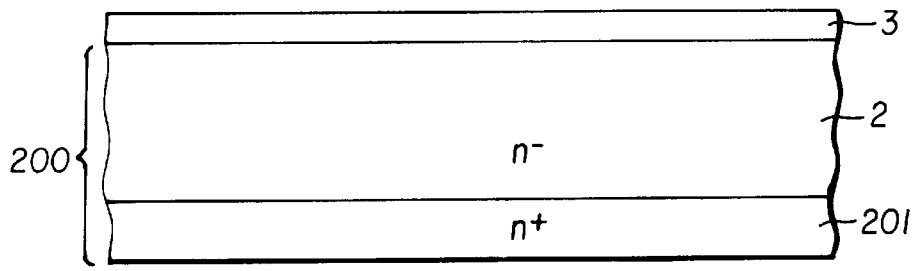
FIG. 8 is a cross section for explaining STEP(1) of a second embodiment of a method of manufacturing a power IC according to the present invention.
Figure 9:
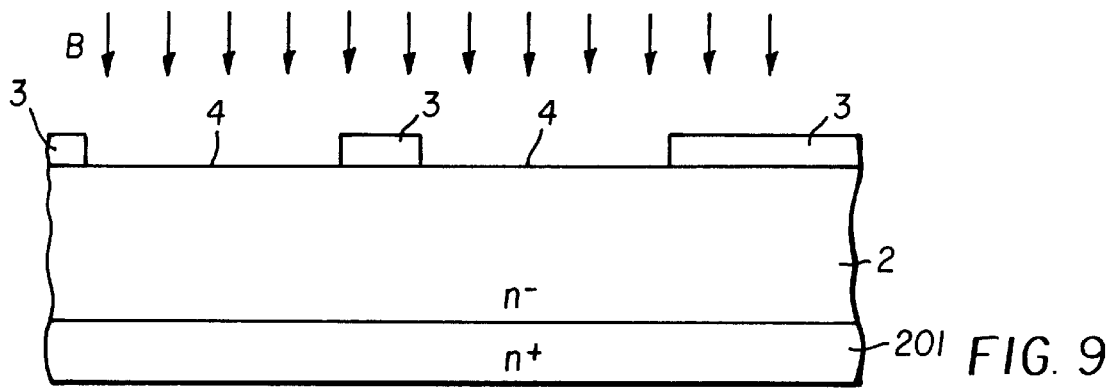
FIG. 9 is a cross section for explaining STEP(2) and STEP(3) of the second embodiment.
Figure 10:
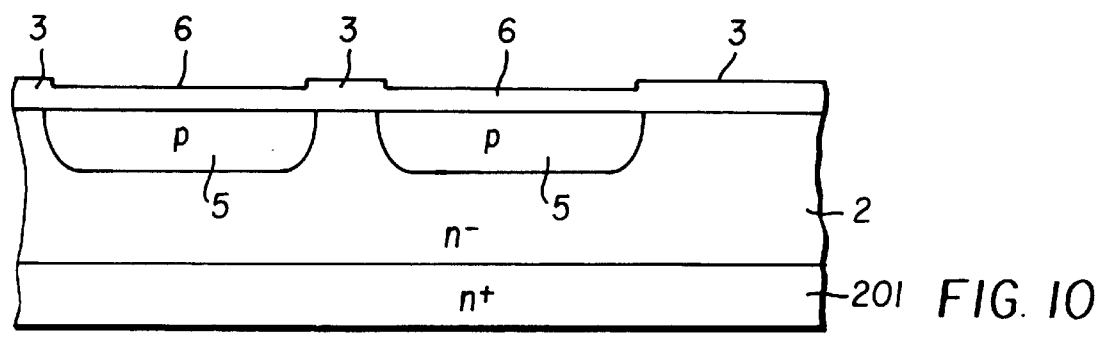
FIG. 10 is a cross section for explaining STEP(4) and STEP(5) of the second embodiment.
Figure 11:
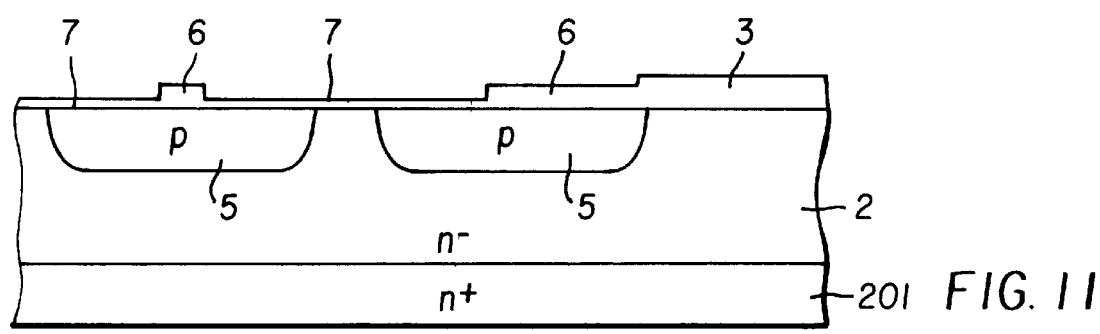
FIG. 11 is a cross section for explaining STEP(6) and STEP(7) of the second embodiment.
Figure 12:
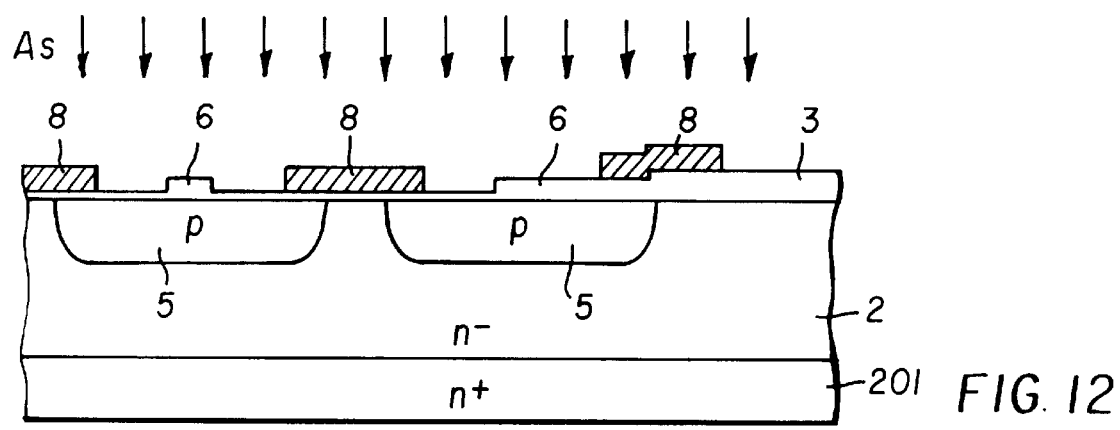
FIG. 12 is a cross section for explaining STEP(8) and STEP(9) of the second embodiment.
Figure 13:
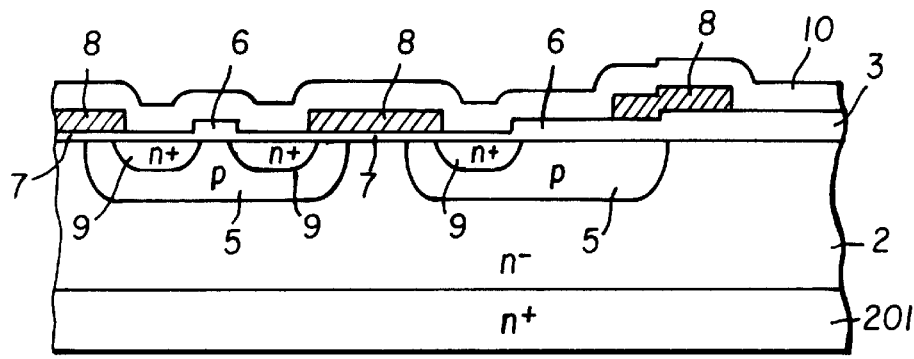
FIG. 13 is a cross section for explaining STEP(10) of the second embodiment.

Referring now to FIG. 8 showing the STEP(1) of the second embodiment, the semiconductor wafer consists of an n-type drain region 201 doped with antimony at $10^{18}$ to $10^{19}$ $cm^{-3}$ and an n-type semiconductor layer 2, doped with phosphorus at $10^{13}$ to $10^{16}$ $cm^{-3}$, epitaxially grown to a thickness of around 100 nm on the drain region 201.

Figure 14:
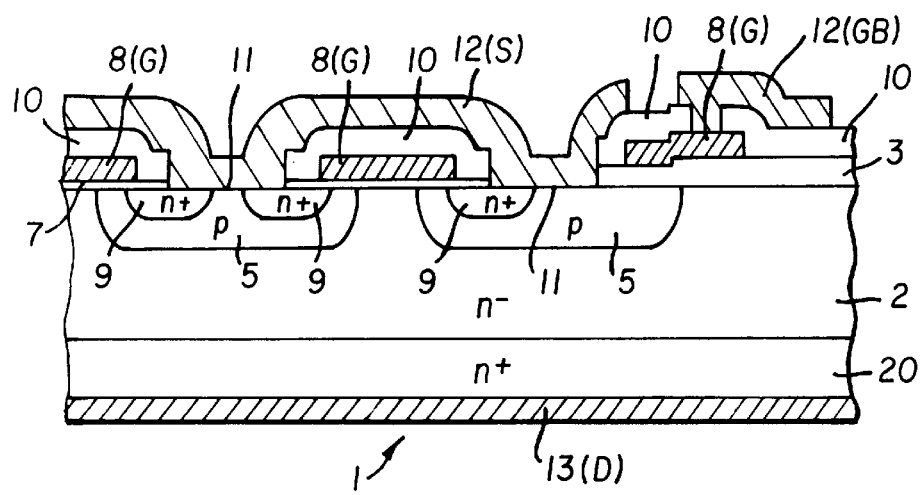
FIG. 14 is a cross section for explaining STEP(11), STEP(12) and STEP(13) of the second embodiment as well as showing the major part of the semiconductor device manufactured by the second embodiment.
Figure 15:
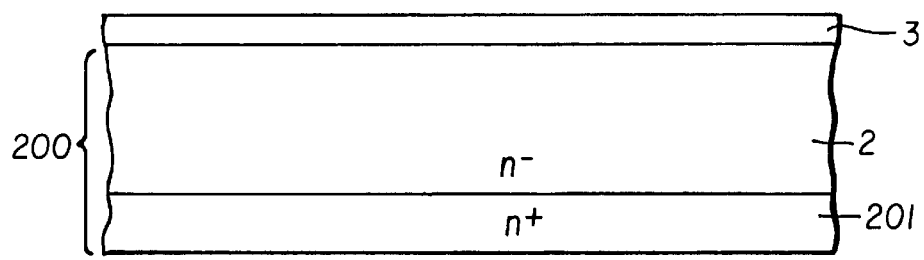
FIG. 15 is a cross section for explaining STEP(1) of a third embodiment of a method of manufacturing a power IC according to the present invention.
Figure 16:
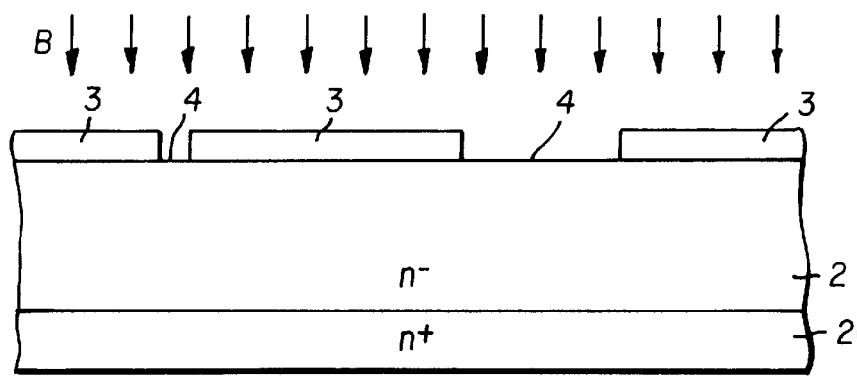
FIG. 16 is a cross section for explaining STEP(2) and STEP(3) of the third embodiment.
Figure 17:
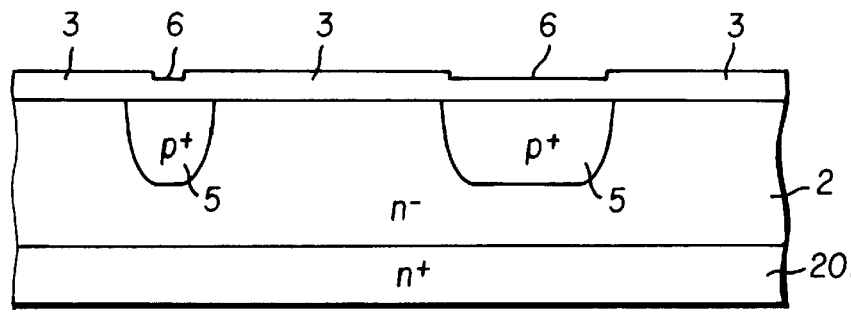
FIG. 17 is a cross section for explaining STEP(4) and STEP(5) of the third embodiment.
Figure 18:
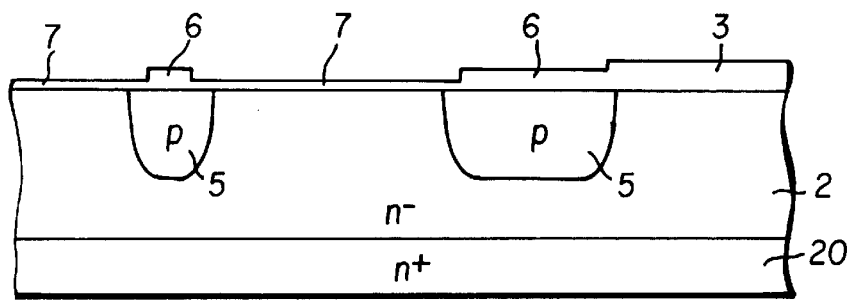
FIG. 18 is a cross section for explaining STEP(6) and STEP(7) of the third embodiment.

FIG. 14 is a cross section of a major portion of the semiconductor device manufactured by the second embodiment of the manufacturing method of the invention, and also illustrates STEP(12) of the second embodiment, in which the thickness of the metal electrode 12 is 3 to 5 µm.

A STEP(13) is added subsequently to the STEP(12) in the second embodiment. In STEP(13), a Ti—Ni—Au triple-layered back electrode 13 is formed on the back surface of the semiconductor wafer 200 by vacuum deposition.

The other STEPs (2) to (11) are the same with those of the first embodiment. The similar parts in FIGS. 8 to 13 are designated by the same reference numerals with those in FIGS. 1 to 6. In FIG. 14, a source electrode 12(S), gate electrode 8(G) and gate wiring 12(GB) are formed on a major surface of the semiconductor wafer 200 and a drain electrode 13(D) on another major surface of the semiconductor wafer 200 to form the semiconductor device 1.

FIGS. 15 to 22 show a third embodiment of a manufacturing method of the present invention. The third embodiment is an example that applies the present invention to a double diffusion type vertical MOSFET in that the p-type regions 5 are relatively heavily doped and formed relatively deep for improving the avalanche withstand capability. Explanation will be made only on the differences between the third and second embodiments. The boron dose in the STEP(3) is large $1 \times 10^4$ to $1 \times 10^{15}$ $cm^{-2}$.

Figure 19:
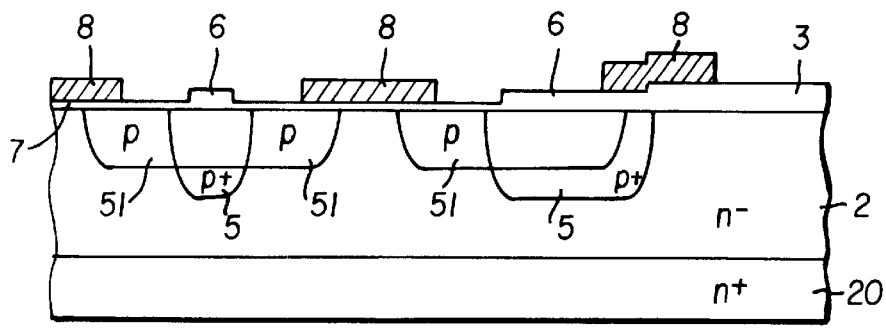
FIG. 19 is a cross section for explaining STEP(8) and STEP(8.1) of the third embodiment.
Figure 20:
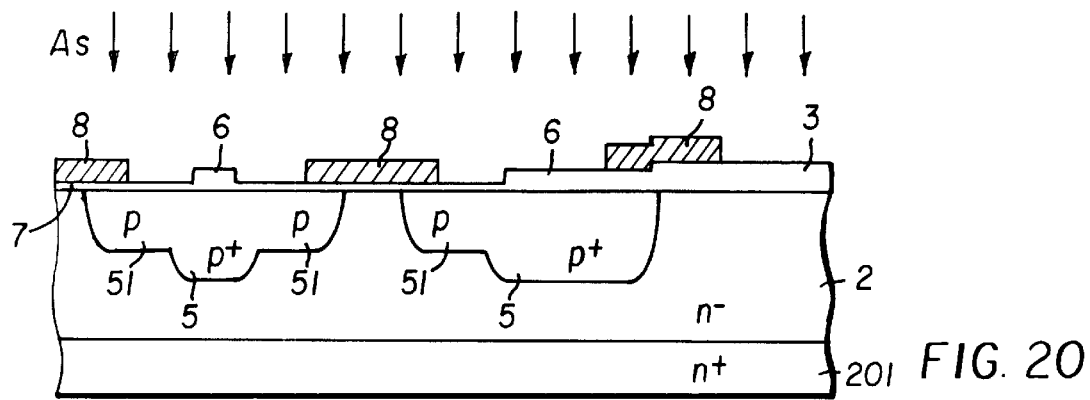
FIG. 20 is a cross section for explaining STEP(9) of the third embodiment.
Figure 21:
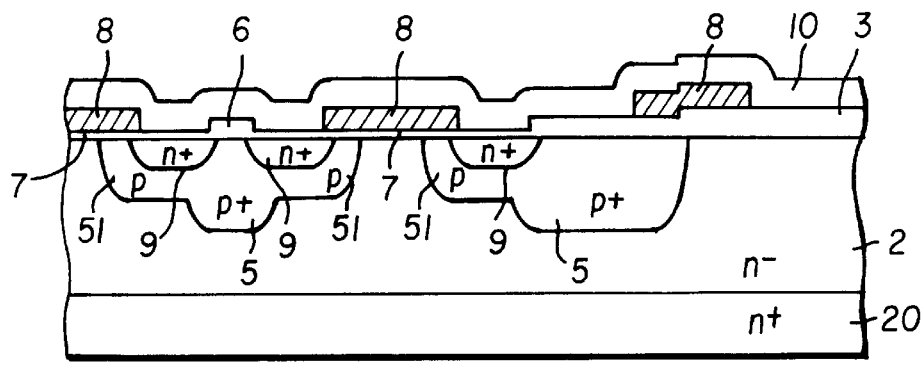
FIG. 21 is a cross section for explaining STEP(10) of the third embodiment.
Figure 22:
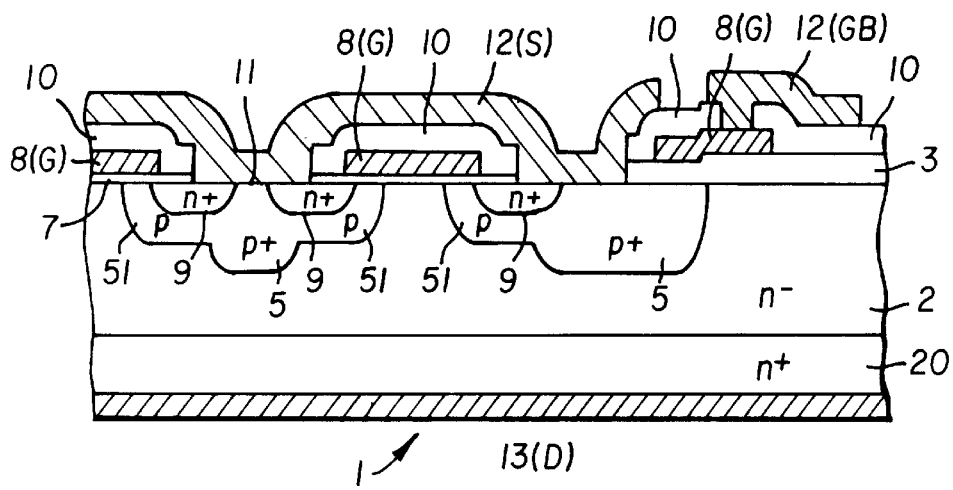
FIG. 22 is a cross section for explaining STEP(11), STEP(12) and STEP(13) of the third embodiment as well as showing the major part of the semiconductor device manufactured by the first embodiment.
Figure 23:
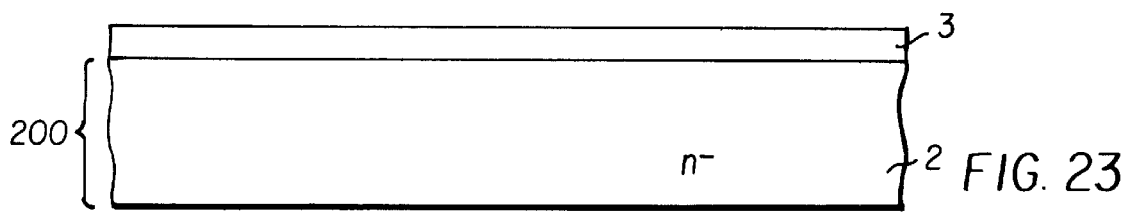
FIG. 23 is a cross section for explaining STEP(1) of a fourth embodiment of a method of manufacturing a power IC according to the present invention.
Figure 24:
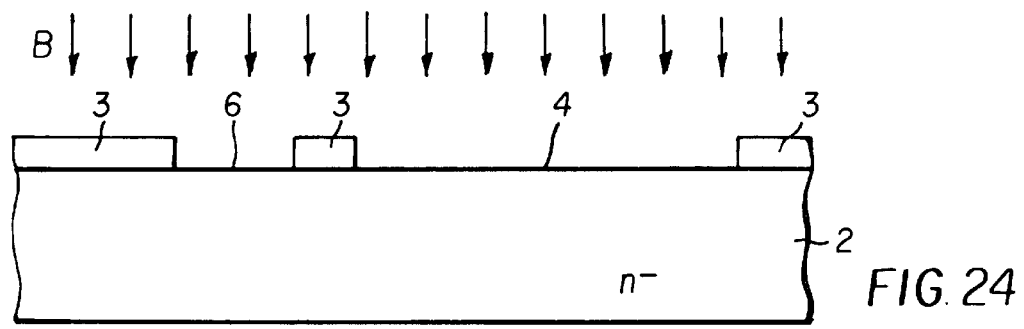
FIG. 24 is a cross section for explaining STEP(2) and STEP(3) of the fourth embodiment.
Figure 25:
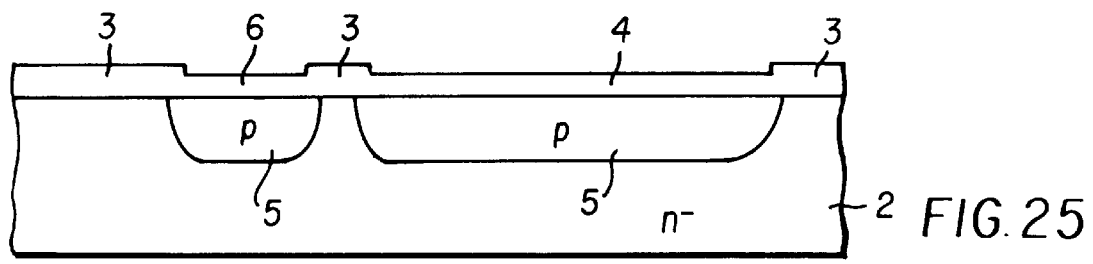
FIG. 25 is a cross section for explaining STEP(4) and STEP(5) of the fourth embodiment.
Figure 26:
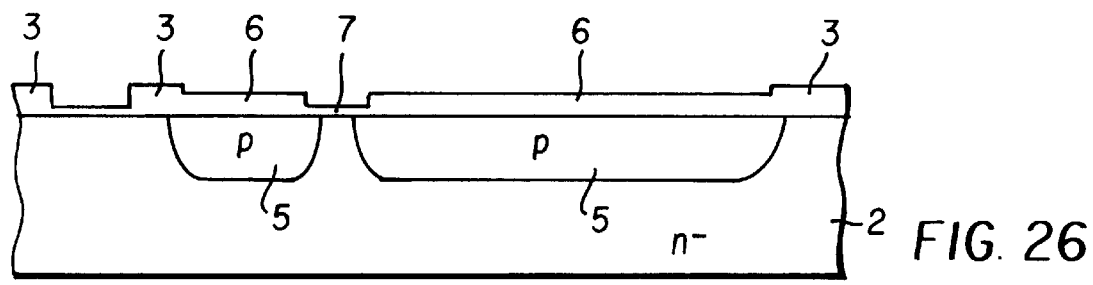
FIG. 26 is a cross section for explaining STEP(6) and STEP(7) of the fourth embodiment.

A STEP(8.1) is inserted between the STEPs (8) and (9). In STEP(8.1), as shown in FIG. 19, second p-type regions 51 are formed, for example, by implanting boron ions at 50 kev at the dose order of $10^{13}$ to $10^{14}$ $cm^{-2}$ and by subsequent heat treatment at 1100° to 1150° C. for 5 hours.

The other STEPs (1) to (13) except the additional step are the same with those of the second embodiment. The similar parts in FIGS. 15 to 22 are designated by the same reference numerals with those in FIGS. 8 to 14.

FIGS. 23 to 30 show a fourth embodiment of a manufacturing method of the present invention. The fourth embodiment is an example that applies the present invention to a lateral MOSFET. Explanation will be made only on the differences between the fourth and first embodiments.

Figure 27:
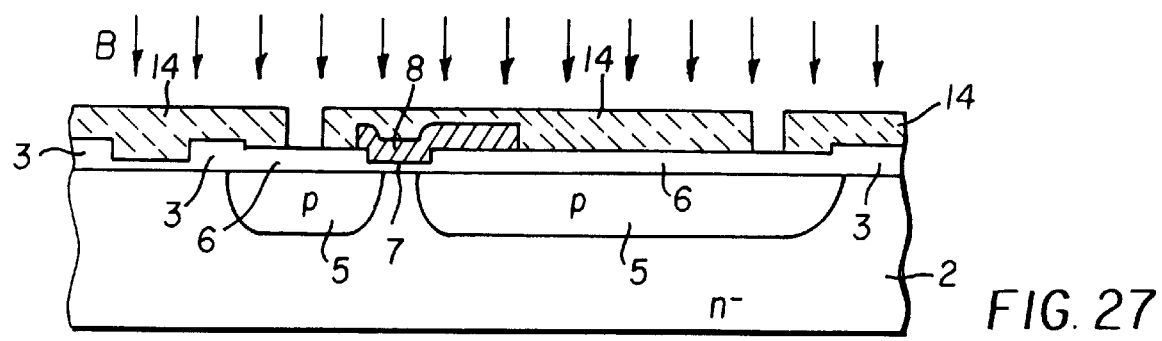
FIG. 27 is a cross section for explaining STEP(8) and STEP(8.1) of the fourth embodiment.
Figure 28:
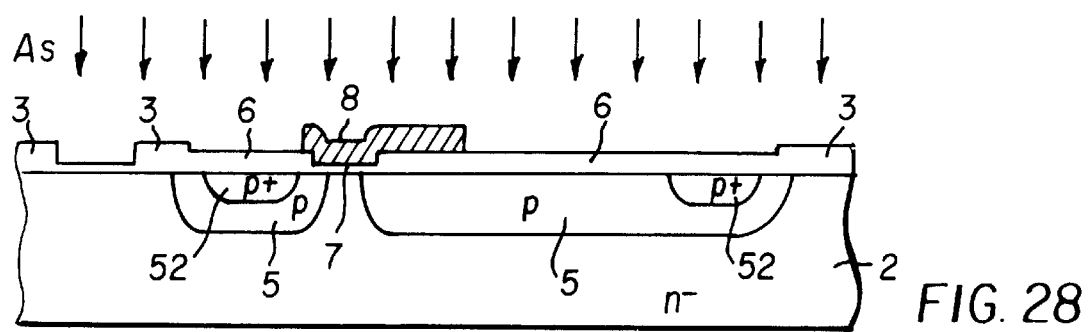
FIG. 28 is a cross section for explaining STEP(9) of the fourth embodiment.
Figure 29:
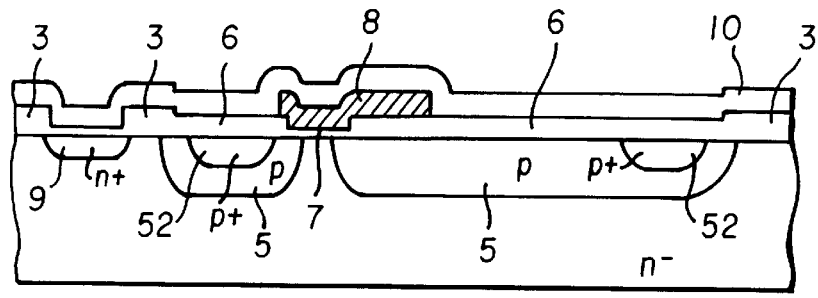
FIG. 29 is a cross section for explaining STEP(10) of the fourth embodiment.
Figure 30:
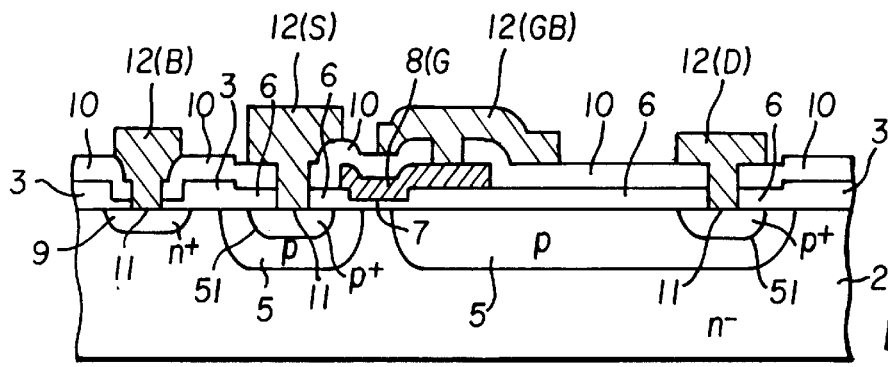
FIG. 30 is a cross section for explaining STEP(11) and STEP(12) of the fourth embodiment as well as showing the major part of the semiconductor device manufactured by the fourth embodiment.

A following STEP(8.1) is added, as with the third embodiment, between the STEPs (8) and (9) in the fourth embodiment. In STEP(8.1), as shown in FIG. 27, a heavily doped p-type regions 52 are formed to improve the contact between the metal electrode 12 and the p-type regions, for example, by implanting boron ions at 150 keV at the dose of $10^{14}$ to $5 \times 10^{15}$ $cm^{-2}$ by using for masking a photoresist film 14 patterned by photolithography and by activating the implanted boron ions by heat treatment at 1000° C. for 10 min. The other STEPs (1) to (12) except the additional step are the same with those of the first embodiment. The similar parts in FIGS. 23 to 29 are designated by the same reference numerals with those in FIGS. 1 to 6. FIG. 30 is a cross section of a major portion of the semiconductor device manufactured by the fourth embodiment of the manufacturing method of the invention. In FIG. 30, a back gate electrode 12(B), source electrode 12(S), drain electrode 12(D) and gate wiring 12(GB) are formed on a major surface of the semiconductor wafer 200 to form the semiconductor device 1.

The method of forming the heavily doped p-type regions 52 by the processing STEP(8.1) is applicable to all the embodiments which will be explained below as well as to all the embodiments already explained.

Figure 31A:
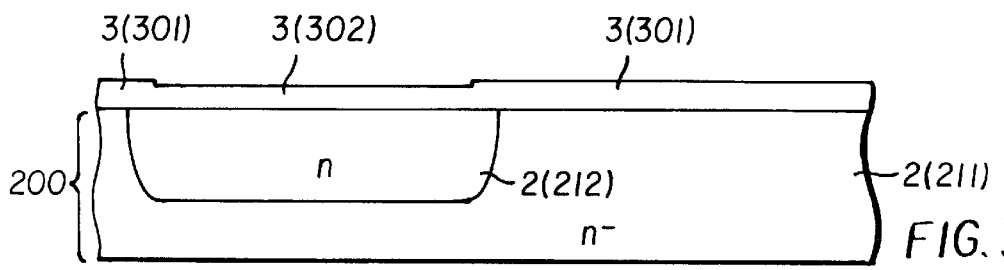
FIG. 31(a) is a cross section for explaining STEPs (1.1) to (1.5) of a fifth embodiment of a manufacturing method according to the present invention.
Figure 31B:
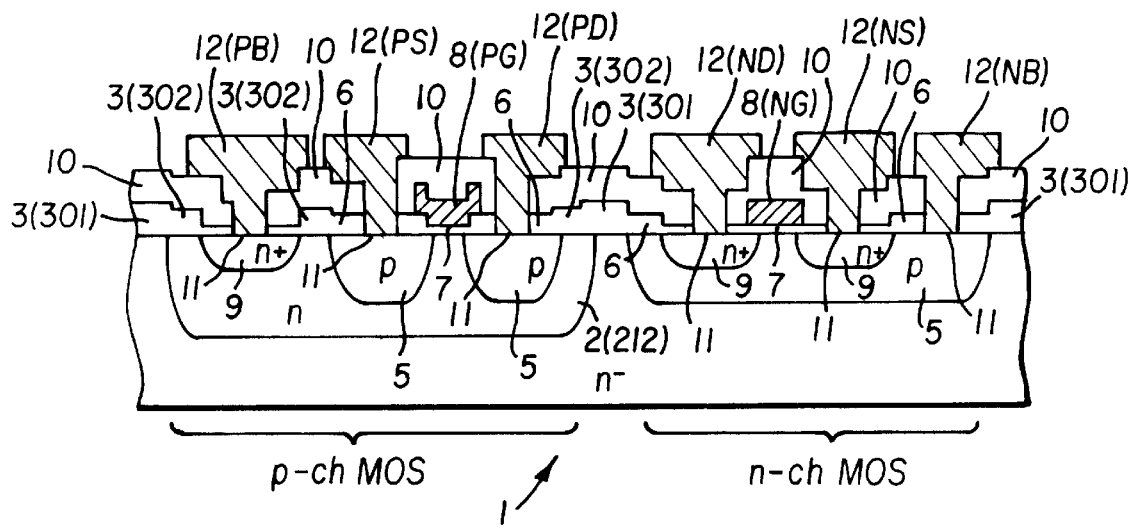
FIG. 31(b) is a cross section of the major part of the semiconductor device manufactured by the fifth embodiment of the present invention.

FIGS. 31(*a*) and 31(*b*) show a fifth embodiment of a manufacturing method of the present invention. The fifth embodiment, that is a modification of the first embodiment, will be explained only on the differences from the first embodiment.

Referring now to FIG. 31(*a*), the n-type semiconductor layer 2 of the semiconductor wafer 200 is comprised of a lightly doped region 2(211) having a dopant concentration of $10^{13}$ to $10^{16}$ $cm^{-3}$ and a heavily doped region 2(212) doped at the dose amount of around $10^{13}$ $cm^{-2}$. By adding processing steps for forming the n-type semiconductor layer 2 as described above, the first insulation film 3 is comprised of a relatively thick portion 3(301) and a relatively thin portion 3(302). The alternative steps of the STEP(1) will be explained below.

STEP(1.1): A silicon oxide film is grown to a thickness of 500 nm by oxidizing the semiconductor wafer 200 comprised of the lightly doped n-type semiconductor layer 2(211) in steam at 1100° C. for 45 min to form an insulation film 3(301), i.e. the thick portion of the first insulation film 3.

STEP(1.2): The insulation film 3(301) is selectively removed with hydrofluoric acid by using a photoresist film patterned by photolithography as a mask.

STEP(1.3): Phosphorus ions are implanted at the dose of around $1 \times 10^{13}$ $cm^{-2}$ at 100 keV.

STEP(1.4): Then, a heavily doped n-type region 2(212) is formed by thermal drive at 1150° C. for 200 min.

STEP(1.5): Finally, a silicon oxide film is grown to a thickness of about 1000 nm by steam oxidation at 1100° C. for about 3 hours to form the thick portion 3(301) and the thin portion 3(302).

These STEPs (1.1) to (1.5) substitute for the STEP(1) of the first embodiment. When the STEP(1.5) is over, the thick portion 3(301) and the thin portion 3(302) are 1100 nm and 1000 nm in thickness, respectively. The other STEPs (2) to (12) are the same with those of the first embodiment. The similar parts in FIGS. 31(*a*) and 31(*b*) are designated by the same reference numerals with those in FIGS. 1 and 7.

FIGS. 32(*a*) and 32(*b*) show a sixth embodiment of a manufacturing method of the present invention. Since the sixth embodiment is almost the same with the second embodiment except a slight difference, explanation will be made only on the slight difference.

Figure 32A:
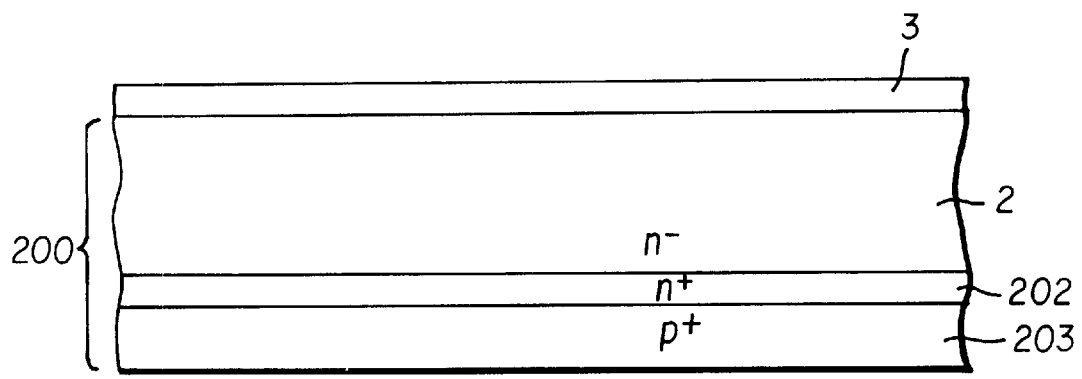
FIG. 32(a) is a cross section for explaining STEP (1) of a sixth embodiment of a manufacturing method according to the present invention.
Figure 32B:
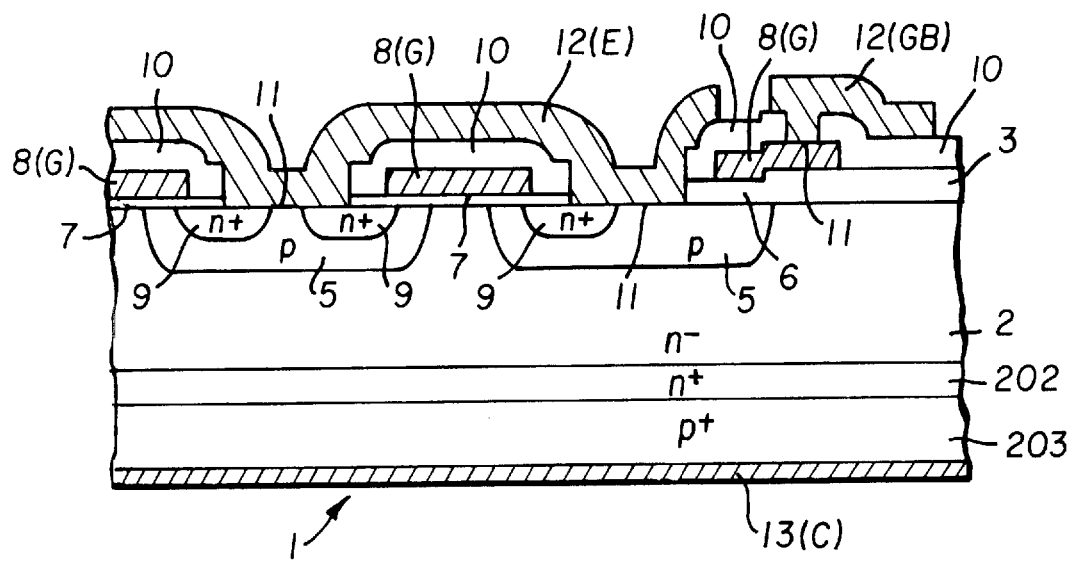
FIG. 32(b) is a cross section of the major part of the semiconductor device manufactured by the sixth embodiment of the present invention.

Referring now to FIG. 32(a), a semiconductor wafer 200 is comprised of a p-type collector region 203 having a boron dopant concentration of around $10^{19}$ cm$^{-3}$; a heavily doped n-type buffer region 202 of 10 to 20 μm in thickness grown on the collector region 203 and having a phosphorus dopant concentration order of $10^{17}$ cm$^{-3}$: and a lightly doped n-type semiconductor layer 2 grown on the buffer layer 202. The other STEPs (2) to (13) are the same with those of the second embodiment. The similar parts in FIGS. 32(a) and 32(b) are designated by the same reference numerals with those in FIGS. 8 and 14. FIG. 32(b) is a cross section of a major portion of the semiconductor device manufactured by the sixth embodiment of the manufacturing method of the invention. In FIG. 32(b), an emitter electrode 12(E), gate electrode 8(G) and gate wiring 12(GB) are formed on a major surface of the semiconductor wafer 200, and a collector electrode 13(C) is formed on the collector region 203, i.e. on another major surface of the semiconductor wafer 200, to form the semiconductor device 1.

Figure 33A:
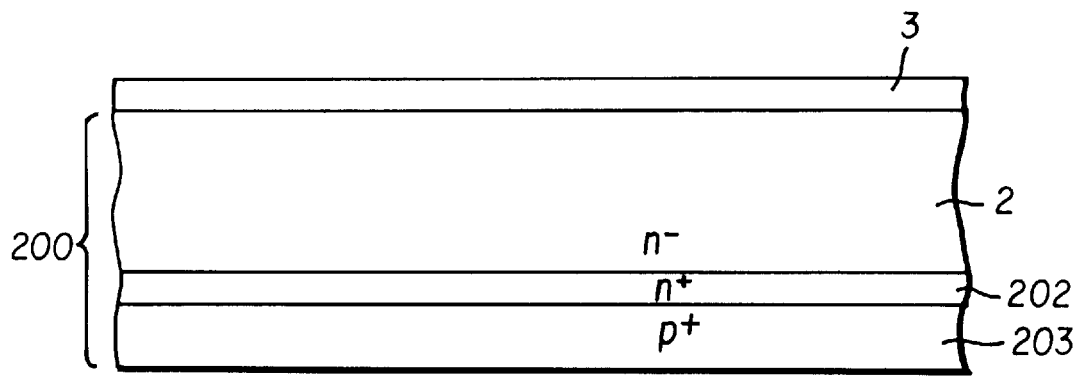
FIG. 33(a) is a cross section for explaining STEP (1) of a seventh embodiment of a manufacturing method according to the present invention.
Figure 33B:
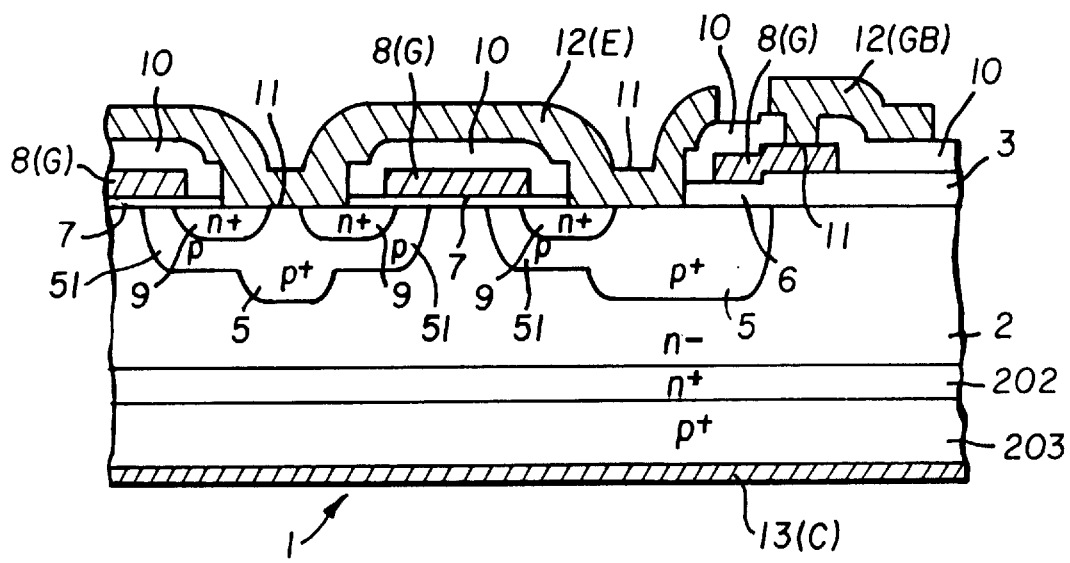
FIG. 33(b) is a cross section of the major part of the semiconductor device manufactured by the seventh embodiment of the present invention.
Figure 34:
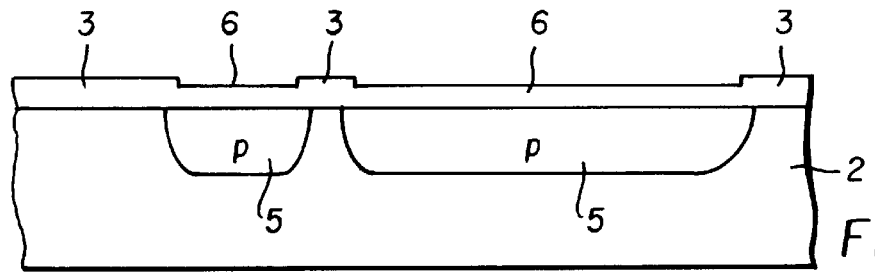
FIG. 34 is a cross section for explaining STEP(4) and STEP(5) of a eighth embodiment of a manufacturing method according to the present invention.
Figure 35:
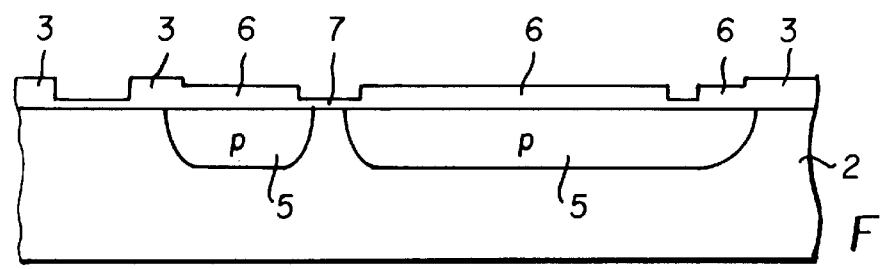
FIG. 35 is a cross section for explaining STEP(6) and STEP(7) of the eighth embodiment.
Figure 36:
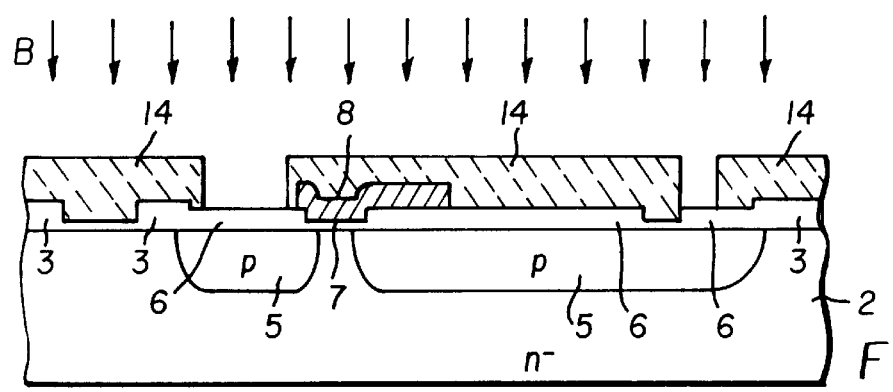
FIG. 36 is a cross section for explaining STEP(8) and STEP(8.1) of the eighth embodiment.

FIGS. 33(a) and 33(b) show a seventh embodiment of a manufacturing method of the present invention. The seventh embodiment is an example that applies the present invention to a double diffusion type vertical IGBT. Referring now to FIG. 33(a), the seventh embodiment is almost the same with the third embodiment except that the semiconductor wafer 200 of the third embodiment is replaced by the semiconductor wafer 200 of the sixth embodiment. The other STEPs (2) to (13) are the same with those of the third embodiment. The similar parts in FIGS. 33(a) and 33(b) are designated by the same reference numerals with those in FIGS. 32(a) and 32(b).

Figure 37:
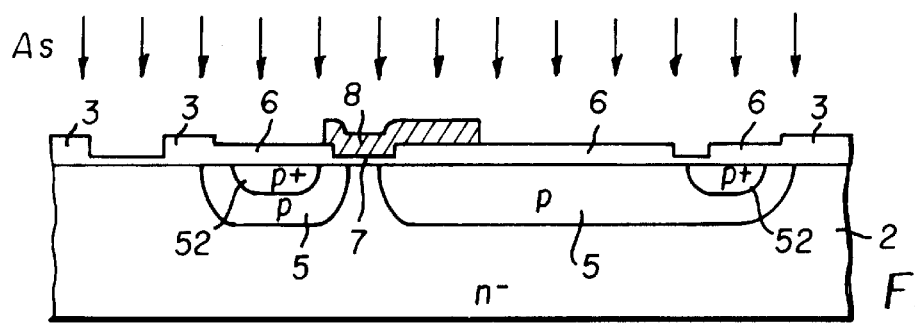
FIG. 37 is a cross section for explaining STEP(9) of the eighth embodiment.
Figure 38:
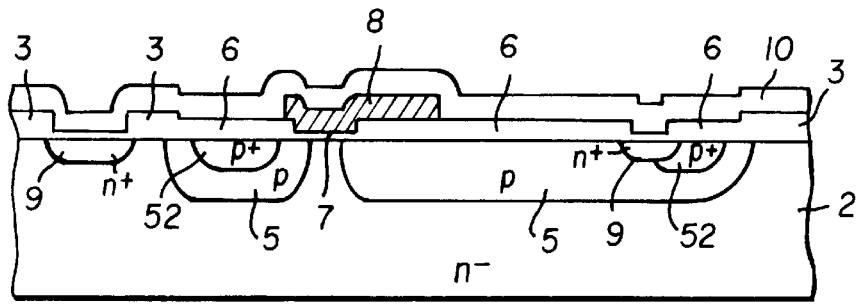
FIG. 38 is a cross section for explaining STEP(10) of the eighth embodiment.
Figure 39:
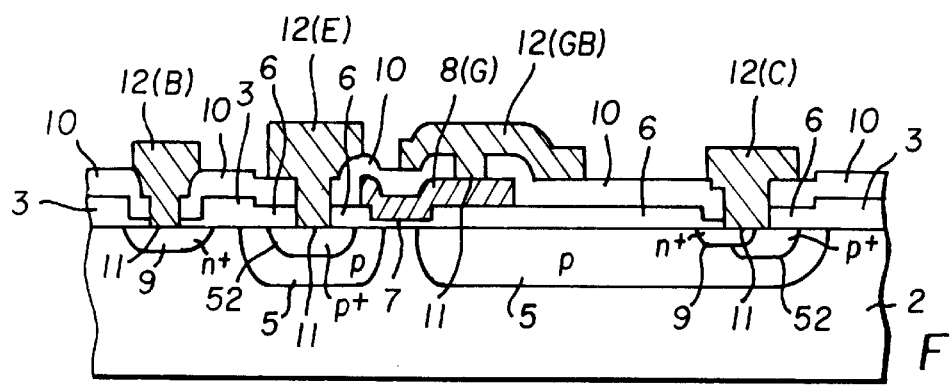
FIG. 39 is a cross section for explaining STEP(11) and STEP(12) of the eighth embodiment as well as showing the major part of the semiconductor device manufactured by the eighth embodiment.

FIGS. 34 to 39 show an eighth embodiment of a manufacturing method of the present invention. The eighth embodiment is an example that applies the present invention to a lateral IGBT. Here, the drawings corresponding to FIGS. 1 to 3 of the first embodiment, for example, are omitted. The processing steps except STEP(9) of the eighth embodiment are almost the same with those of the fourth embodiment. Referring to FIG. 37 that shows the STEP(9) of the eighth embodiment, a heavily doped n-type regions 9 is formed in the heavily doped p-type regions 52 that constitute a drain region. The STEPs (1) to (8) and the STEPs (10) to (12) are the same with those of the fourth embodiment. The similar parts in FIGS. 34 to 39 are designated by the same reference numerals with those in FIGS. 25 to 30.

Figure 40A:
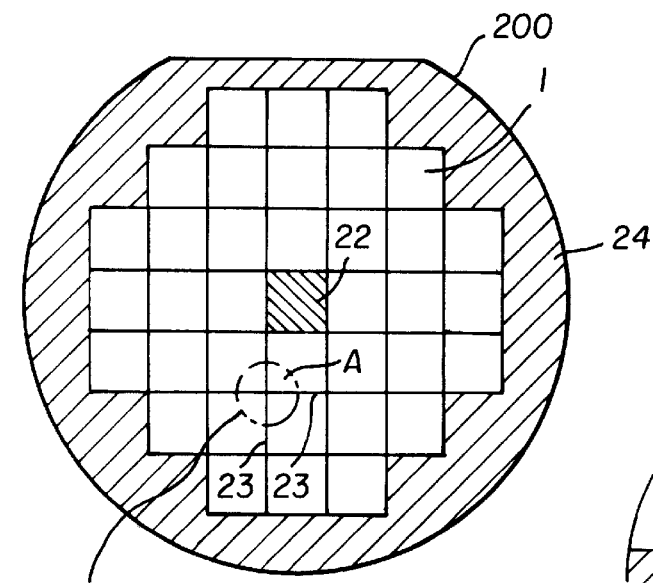
FIG. 40(a) is a top plan view of a ninth embodiment of the invention for showing a monitor region located on the semiconductor wafer.
Figure 40B:
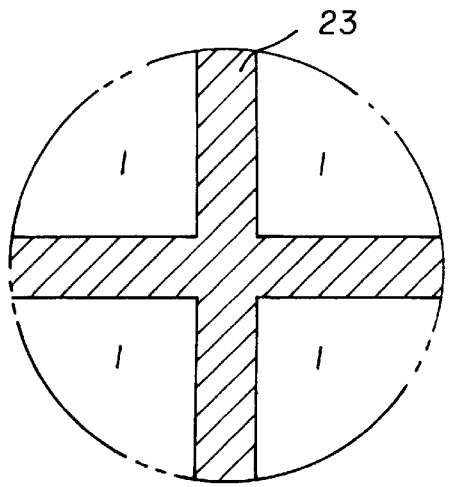
FIG. 40(b) is an expanded view of FIG. 40(a) for showing scribe lines on the semiconductor wafer.

FIGS. 40(a) and 40(b) show a ninth embodiment of the invention. More specifically, FIGS. 40(a) and 40(b) show a location in which a monitor region 22, used in the STEP(11) of the first embodiment for judging the end of the etching of the contact holes, is arranged. FIG. 40(a) shows a monitor region 22 surrounded by four semiconductor devices 1 arranged on the semiconductor wafer 200 and a peripheral region 24 of the wafer 200 on which the semiconductor devices 1 are not arranged. FIG. 40(b) is an expanded view of FIG. 40(a) for clearly showing scribe lines 23. The monitor region 22 may be used alone or a plurality of monitor region 22 may be located on any combined locations of the surrounded region, peripheral region and scribe line.

Figure 41:
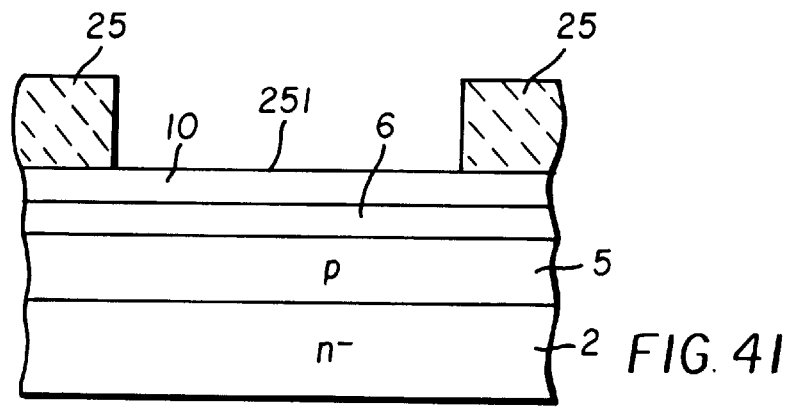
FIG. 41 is a cross section of the monitor region of FIG. 40(a)
Figure 42:
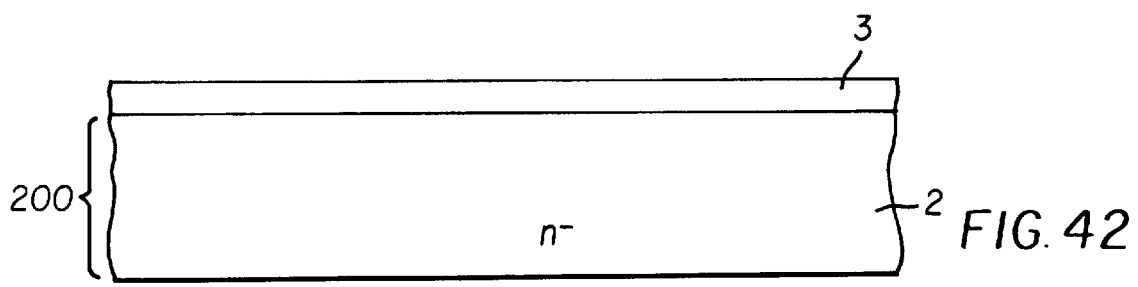
FIG. 42 is a cross section for explaining STEP(1) of the prior art.
Figure 43:
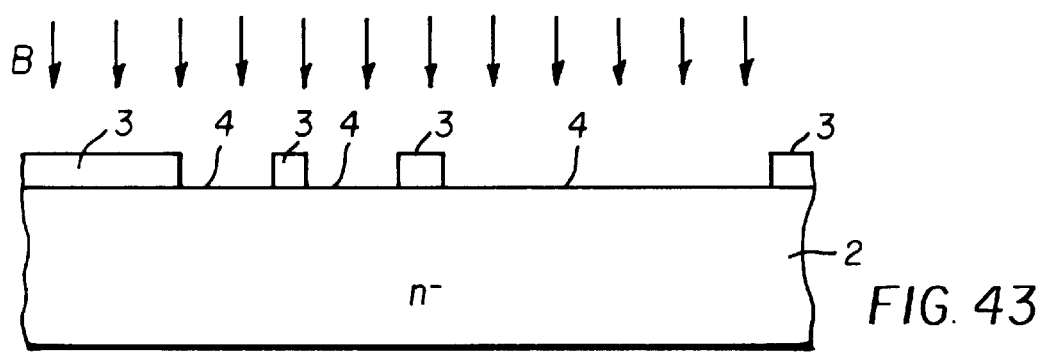
FIG. 43 is a cross section for explaining STEP(2) and STEP(3) of the prior art.
Figure 44:
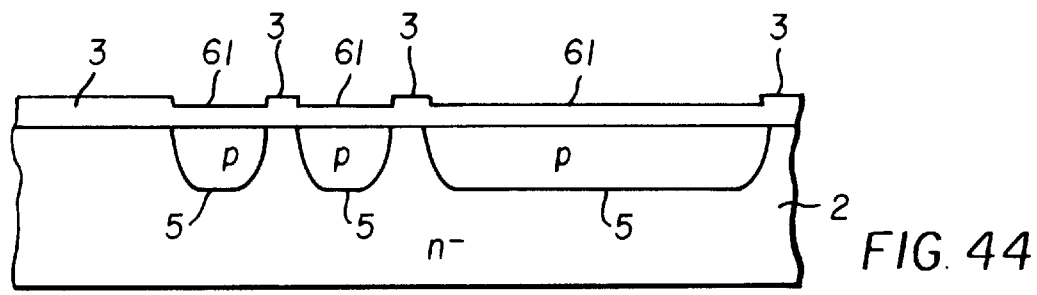
FIG. 44 is a cross section for explaining STEP(4) and STEP(5) of the prior art.
Figure 45:
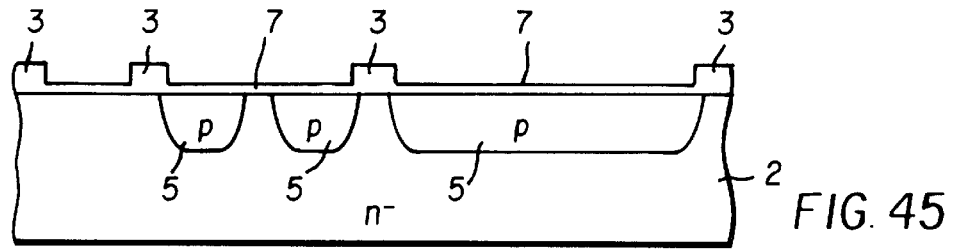
FIG. 45 is a cross section for explaining STEP(6) and STEP(7) of the prior art.
Figure 46:
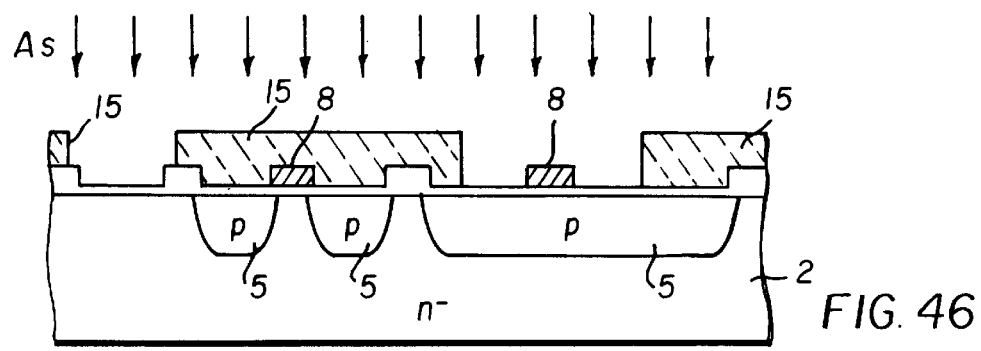
FIG. 46 is a cross section for explaining STEP(8) and STEP(9) of the prior art.
Figure 47:
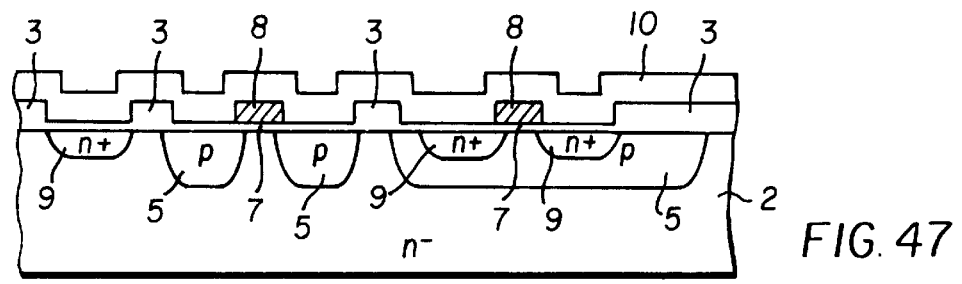
FIG. 47 is a cross section for explaining STEP(10) of the prior art.
Figure 48:
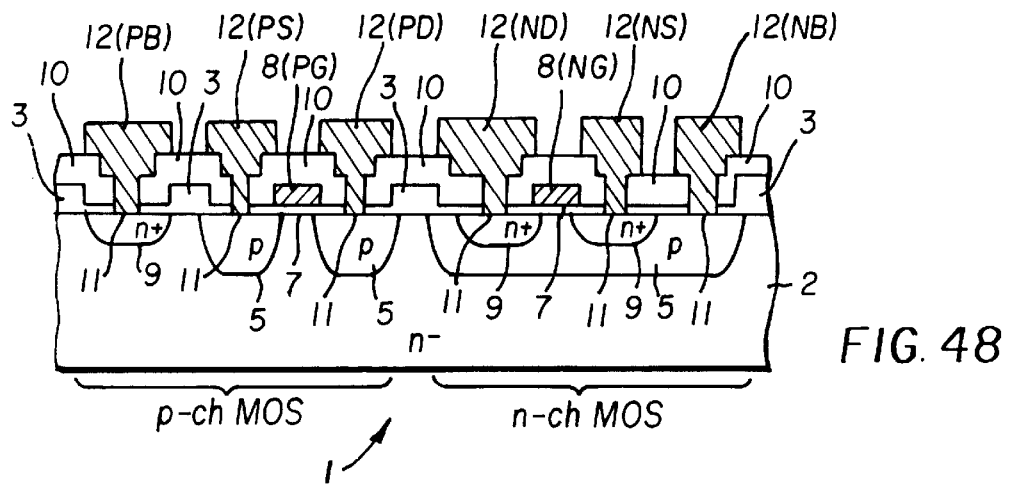
FIG. 48 is a cross section for explaining STEP(11) and STEP(12) of the prior art as well as showing the major part of the semiconductor device manufactured by the prior art.

FIG. 41 is a cross section of the monitor region of FIG. 40. At the time of etching, the monitor region has a second insulation film 6 and a fourth insulation film 10 laminated on the p-type region 5 formed on the n-type semiconductor layer 2. A photoresist film 25 formed on the fourth insulation film 10 as an etching mask has an opening 251 on the region.

Although the present invention has been described in connection with preferred embodiments thereof, many variations will now become apparent to those skilled in the art. For example, by reversing the respective conductivity types of each semiconductor regions, the present invention is applicable to n-channel devices and p-channel devices. Modifications of the invention will also become apparent to those skilled in the art. For example, a fifth insulation film may be formed by removing the third insulation film except the region thereof beneath the gate electrode 8 by etching with hydrofluoric acid using the gate electrode 8 as a mask and by subsequently oxidizing the portion, from the top thereof the third insulation film has been removed. It is also apparent that the possible modifications include addition of various semiconductor regions, insulation films, conductive films and protective films which have not been described in the above described embodiments. And, it is apparent that the second insulation film may be formed prior to, after or simultaneously with the formation of the p-type region.

By combining any one of the first and fifth embodiments with any one of the second, third, fourth, sixth, seventh and eighth embodiments or by combining the embodiments of the invention with other processing steps known to those skilled in the part, a power IC is constructed.

By applying the present invention to the process of manufacture of ICs, vertical MOSFETs, vertical IGBTs, lateral MOSFETs or lateral IGBTs, a sheet of photo-mask (one photo-processing step) is reduced in manufacturing at lower cost the semiconductor devices which exhibit the same performance with that of the respective prior arts.

What is claimed is:

1. A method of manufacturing at least one semiconductor device on at least one of a single- and multi-layered semiconductor substrate, the method comprising the steps of:

forming a first insulation film on a major surface of a layer of a first conductivity type of said semiconductor substrate;

selectively removing a part of said first insulation film to form at least one window in the first insulation film;

implanting impurity ions of a second conductivity type into said layer of the first conductivity type through said at least one window;

selectively forming at least one region of the second conductivity type by thermally diffusing said implanted impurity ions into said layer of the first conductivity type;

forming a second insulation film over said window;

selectively removing a part of said first and second insulation films thereby to expose a part of said layer of the first conductivity type and a part of said at least one region of the second conductivity type;

forming third insulation films on said exposed part of said layer of the first conductivity type and said exposed part of said at least one region of the second conductivity type;

forming gate electrodes on said third insulation films;

forming heavily doped regions of the first conductivity type by selectively implanting impurity ions of the first conductivity type, using said first insulation film, said second insulation film and said gate electrodes for masking, into the portions of said layer of the first conductivity type and said at least one region of the second conductivity type, said portions being not covered with said first insulation film, said second insulation film and said gate electrodes;

forming a fourth insulation film atop said at least one semiconductor device; and simultaneously forming at least one contact hole that reaches said at least one region of the second conductivity type through said fourth and second insulation films and at least one contact hole that reaches said heavily doped regions of the first conductivity type through said fourth insulation film.

2. The method of claim 1, wherein said second insulation film is at least twice as thick as the average implantation depth of said impurity ions of the first conductivity type in the insulation film.

3. The method of claim 1, wherein said second insulation film is ten times or less as thick as the average implantation depth of said impurity ions of the first conductivity type in the insulation film.

4. The method of claim 1, wherein a plurality of the semiconductor devices are arranged on said semiconductor substrate, and wherein at least one monitor region, for judging the end of etching for removing said fourth and second insulation films at the formation of said contact holes, is formed on at least one of said at least one region of the second conductivity type, said at least one of said at least one region being formed on a portion of said semiconductor substrate wherein said plurality of the semiconductor device are not arranged, said at least one monitor region comprising a second insulation film and a fourth insulation film laminated on said at least one of said at least one region of the second conductivity type, said etching being terminated after said second and fourth insulation films has been removed and said at least one of said at least one region has been exposed.

5. The method of claim 4, wherein said at least one monitor region is arranged outside the region of said semiconductor substrate wherein said plurality of the semiconductor devices are arranged.

6. The method of claim 5, wherein said at least one monitor region is surrounded by a plurality of the semiconductor devices.

7. The method of claim 5, wherein said at least one monitor region is arranged on at least one of scribe lines disposed for separating each of said plurality of the semiconductor devices.

8. The method of claim 5, wherein said at least one monitor region is arranged in the peripheral region of said semiconductor substrate wherein said plurality of the semiconductor devices are not arranged.

9. The method of claim 1, wherein said contact holes are formed by etching said fourth and second insulation films, and said etching is terminated after a predetermined period of time has elapsed, said predetermined period consisting of a leeway period and an estimated period, said estimated period being a determined period of time during which said fourth and second insulation films are completely removed.

10. The method of claim 1, wherein the step of forming the second insulation film is performed prior to the formation of said at least one region of the second conductivity type.

11. The method of claim 1, wherein the step of forming the second insulation film is performed after the formation of said at least one region of the second conductivity type.

* * * * *